United States Patent
Lee et al.

(10) Patent No.: US 6,743,660 B2
(45) Date of Patent: Jun. 1, 2004

(54) METHOD OF MAKING A WAFER LEVEL CHIP SCALE PACKAGE

(75) Inventors: Hsin-Hui Lee, KaoHsiung (TW); Chia-Fu Lin, Hsin-Chu (TW); Chao-Yuan Su, Hsin-Chu (TW); Yen-Ming Chen, Hsin-Chu (TW); Kai-Ming Ching, Taiping (TW); Li-Chih Chen, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 148 days.

(21) Appl. No.: 10/045,783

(22) Filed: Jan. 12, 2002

(65) Prior Publication Data

US 2003/0134496 A1 Jul. 17, 2003

(51) Int. Cl.$^7$ .......................... H01L 21/48; B23K 31/02; H01R 9/00
(52) U.S. Cl. .................. 438/108; 438/613; 438/637; 438/691; 438/700; 228/180.22; 29/842; 29/844; 29/874; 29/884
(58) Field of Search ........................ 438/22, 26, 48, 438/106–108, 125–127, 584, 597, 611–615, 618, 622, 623, 629, 637, 639, FOR 342, FOR 343, FOR 348; 228/101, 178, 179.1, 180.1, 180.21, 180.22; 29/592, 592.1, 825, 829, 832, 837–846, 874–876, 884; 361/600, 679, 748, 760, 767, 777, 772–774, 807, 808; 257/678, 690, 692, 730, 734–738, 773, 774, 786, 787

(56) References Cited

U.S. PATENT DOCUMENTS

| | | | | |
|---|---|---|---|---|
| 5,851,911 A | * | 12/1998 | Farnworth | 438/614 |
| 6,277,669 B1 | * | 8/2001 | Kung et al. | 438/106 |
| 6,372,619 B1 | * | 4/2002 | Huang et al. | 438/597 |
| 6,511,901 B1 | * | 1/2003 | Lam et al. | 438/612 |
| 6,541,303 B2 | * | 4/2003 | Akram et al. | 438/106 |
| 6,602,775 B1 | * | 8/2003 | Chen et al. | 438/612 |

* cited by examiner

Primary Examiner—Alonzo Chambliss
(74) Attorney, Agent, or Firm—Tung & Associates

(57) ABSTRACT

A method of forming a bump on a substrate such as a semiconductor wafer or flip chip. The method includes the act of providing a semiconductor device having a contact pad and having an upper passivation layer and an opening formed in the upper passivation layer exposing a portion of the contact pad. An under bump metallurgy is deposited over the upper passivation layer and the contact pad. An electrically conductive redistribution trace is deposited over the under bump metallurgy. A photoresist layer is deposited, patterned and developed to provide portions selectively protecting the electrically conductive redistribution trace and the under bump metallurgy. Excess portions of the electrically conductive redistribution trace and under bump metallurgy not protected by the photoresist are removed.

20 Claims, 5 Drawing Sheets

METHOD OF MAKING A WAFER LEVEL CHIP SCALE PACKAGE

FIELD OF THE INVENTION

This invention relates to a method of making a bump on a substrate, and more particularly, to a method of making a wafer level chip scale package that includes a metal layer to redistribute very fine-pitched peripheral arrayed pads on a chip to a much larger pitch area arrayed pads.

BACKGROUND OF THE INVENTION

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with a wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach" because the chip is directly attached to the substrate, board, or carrier by the conductive bumps.

The use a flip chip packaging has dramatically grown as a result of the flip chip's advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulting in a high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill. A brief description of the prior art methods of performing the first step will provide a better background for understanding the present invention.

The first step in a typical solder bumping process involves preparing the semiconductor wafer bumping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

A variety of UBM structures are known to those skilled in the art that accomplish the above functions and have one, two, three or more layers depending on whether the bump is gold, copper, aluminum, solder or nickel based. For gold based bumps, known UBM structure include layers of Cr—Cu, Ti—Pd, Ti—W, or Ti—Pt. For copper based bumps, known UBM structures include layers of Cr—Cu, or Al—Ni. For aluminum based bumps, known UBM structure include layers of Ti or Cr. For solder based bumps, known UBM structures include layers of Cr—Cu—Au, Ni—Cu, Ti—Cu, TiW—Cu, Ni—Au, or Al—NiV—Cu. For nickel based bumps, known UBM structure include layers of nickel. The UBM layers may be deposited by electroplating, evaporation, printing, electroless plating, and/or sputtering. It is also known to deposit one or more seed layers over the UBM structure prior to depositing the electrically conductive material (such as solder) that forms the bump.

In fabricating a flip-chip bond structure, the fabrication process requires a tight control of interface processes and manufacturing parameters in order to meet very small dimensional tolerances. Various techniques may be utilized to fabricate a UBM structure and to deposit the solder bump. A few widely used methods of depositing bumps include evaporation, electroplating, electroless plating and screen-printing. Kung et al, U.S. Pat. No. 6,179,200 provides a description of these more widely used methods of depositing bumps as follows.

The formation of solder bumps can be carried out by an evaporation method of Pb and Sn through a mask for producing the desired solder bumps. When a metal mask is used, UBM metals and solder materials can be evaporated through designated openings in the metal mask and be deposited as an array of pads onto the chip surface.

In one prior art evaporation method, a wafer is first passivated with an insulating layer such as $SiO_2$, via holes are then etched through the wafer passivation layer to provide a communication path between the chip and the outside circuit. After a molybdenum mask is aligned on the wafer, a direct current sputtering cleans the via openings formed in the passivation layer and removes undesirable oxides. A cleaned via opening assures low contact resistance and good adhesion to the $SiO_2$. A chromium layer is evaporated through a metal mask to form an array of round metal pads each covering an individual via to provide adhesion to the passivation layer and to form a solder reaction barrier to the aluminum pad underneath. A second layer of chromium/copper is then co-evaporated to provide resistance to multiple reflows. This is followed by a final UBM layer of pure copper which forms the solderable metallurgy. A thin layer of gold may optionally be evaporated to provide an oxidation protection layer. These metal-layered pads define the solder wettable regions on the chips, which are commonly referred to as the ball limiting metallurgy (BLM) or under bump metallurgy (UBM). After the completion of UBM, solder evaporation occurs through a metal mask, which has a hole diameter slightly greater than the UBM mask-hole diameter. This provides the necessary volume for forming a subsequent solder ball. A solder reflow process is performed at a temperature of about 350° C. to melt and homogenize the evaporated metal pad and to impart a truncated spherical shape to the solder bump. The evaporation method, even though well established and has been practiced for a long time in the industry, is a slow process and thus can not be run at a high throughput rate.

A second method for forming solder bumps is the electroplating method. In an electroplating process, UBM layers are first deposited, followed by the deposition of a photoresist layer, the patterning of the photoresist layer, and then the electro-deposition of a solder material into the photoresist openings. After the electro-deposition process is completed, the photoresist layer can be removed and the UBM layers can be etched by using the plated solder bumps as a mask. The solder bumps are then reflowed in a furnace reflow process. The photolithography/electroplating technique is a simpler technique than evaporation and is less expensive because only a single masking operation is required. However, electroplating requires the deposition of a thick and uniform solder over the entire wafer area and etching metal layers on the wafer without damaging the plated solder layer. The technique of electroless plating may also be used to form the UBM structure.

Another solder bump formation technique that is capable of solder-bumping a variety of substrates is a solder paste screening method. The screen printing technique can be used to cover the entire area of an 8-inch wafer. In this method, a wafer surface covered by a passivation layer with bond pads exposed is first provided. UBM layers are then deposited on top of the bond pads and the passivation layer. A photoresist layer is deposited over the UBM. The portions of the UBM are etched followed by stripping off the photoreisist layer. A stencil is then aligned on the wafer and solder paste is squeegeed through the stencil to fill the openings on top of the bond pads and the UBM layers. After the stencil is removed, the solder bumps may be reflowed in a furnace to form solder balls.

One drawback of the solder paste screen printing process is that, with the recent trend in the miniaturization of device dimensions and the reduction in bump to bump spacing (or pitch), the prior art solder paste screening techniques become impractical. For instance, one of the problems in applying solder paste screening technique to modern IC devices is the paste composition itself. A paste in generally composed of a flux and solder alloy particles. The consistency and uniformity of the solder paste composition becomes more difficult to control with a decreasing solder bump volume. A possible solution for this problem is the utilization of solder paste that contains extremely small and uniform solder particles. However, this can only be achieved at a very high cost penalty. Another problem is using the solder paste screening technique in modern high-density devices is the reduced pitch between bumps. Since there is a large reduction in volume from a paste to the resulting solder bump, the screen holes must be significantly larger in diameter than the final bumps. It is therefore generally desirable to form solder bumps that are reflown into solder balls with a larger height and a larger pitch between the balls.

Several other methods are known to those skilled in the art for producing solder bumps on a semiconductor device. One such method is called the solder jet printing method. The solder jet printer method is based upon piezoelectric demand mode ink jet printing technology and is capable of producing and placing molten solder droplets 25–125 micrometers in diameter at rates of up to 2000 per second. In demand mode ink jet printing systems, a volumetric change in the fluid is induced either by the displacement of piezoelectric material that is coupled to the fluid or by the formation of the vapor bubble in the ink caused by heating a resistive element. The volumetric change causes pressure transience to occur in the fluid, and these are directed so as to produce a drop that issues from an orifice. A droplet is created only when it is desired in demand mode systems. Demand mode ink jet printing produces droplets that are approximately equal to the orifice diameter of the droplet generator.

Another method for producing solder bumps is known as the micro-punching method. In the micro-punching method, solder tape is supplied from a spool and rolled up by a motor driven spool. A micro-punch is driven by an electric actuator and a displacement enlarging mechanism. A micro-punch and die set blanks a thin solder tape and forms a small cylindrical piece. A solder flux may be formed over the entire semiconductor wafer to be bumped and the solder pieces may be punched and placed directly onto the wafer.

FIGS. 1A–G illustrate the steps of the prior art method of forming a bump on a semiconductor device. The semiconductor device 50 is provided having a base silicon portion 52 having a plurality of device structures formed therein and metal interconnections provided over and connected to the device structures (not shown). A bond pad 54 is provided in the upper surface of the semiconductor device 50. A passivation layer 56 such as silicon dioxide may be provided over the silicon base 52 and having an opening 58 formed therein exposing a portion of the bond pad 54 (FIG. 1A).

A removable buffer material 60 may be provided and may include a first layer 62 overlying the contact pad and optionally a second layer 64 overlying the first layer 62 (FIG. 1B). The first layer 62 of the removable buffer material 60 may be a dry film photoresist layer at least 100 microns thick. A second layer may be a spun on photoresist layer. A stress buffer material 66 is deposited over the semiconductor device to encapsulate the removable buffer material 60 (FIG. 1C). The stress buffer material may be any one of a variety of stress buffer materials such as, for example, a polyimide, benzocyclobutene (BCB), or a modified polyimide prepreg with an evaporative solvent such as N-methylpyrollidone. The top portion of the stress buffer layer 66 and the second layer 64 of the removable stress buffer material 60 is removed to expose the first layer 62 of the removable buffer material 60. Preferably, the top portion of the stress buffer layer 66 and the second layer 64 of the removable stress buffer material 60 are removed by chemical mechanical planarization using a planarizing wheel 61 as shown in FIG.

1D. Thereafter, the first layer 62 of the removable buffer material is removed by, for example, wet etching to provide an opening 70 in the stress buffer layer 66 down to the bond pad 54 (FIG. 1E). An under bump metallurgy structure (UBM) 72 is deposited into the opening 70 in the stress buffer layer 66 to make contact with the bond pad 54. The UBM may include a plurality of layers as described above, and preferably includes a titanium layer contacting the bond pad 54 and copper layer overlying the titanium layer. An electrically conductive material 74 is deposited into the opening 70 in the stress buffer layer 66 and onto the UBM structure 72 (FIG. 1F). The electrically conductive material 74 may be any one of a variety of metals, metal alloys or metals and other materials known to those skilled in character and may include, for example, gold, copper, aluminum, solder, and/or nickel. Finally, the electrically conductive material 74 is reflown by heating to form a bump 76 on a semiconductor device 50 (FIG. 1G).

One of the most cost-effective packaging techniques is known as direct chip attach wherein a solder bumped flip chip is directly attached to a printed circuit board. However, due to the thermal expansion mismatch between the silicon chip and the printed circuit board (made from an epoxy or fiberglass material), an underfill encapsulant is usually needed for solder joint reliability. Due to the underfill operation, the manufacturing costs is increased in the manufacturing throughput is often substantially reduced. Further, reworking an underfill flip chip on a printed circuit board is practically impossible.

Another drawback of direct chip attach type microelectronic packaging techniques has to do with the pitch and size of the pads on the peripheral-arrayed chip. For direct chip attached assemblies, the bond pads are very small and result in high demand on the underlying printed circuit board.

Wafer level chip scale packages provide advantages over direct chip attached assemblies. In a wafer level chip scale package, a metal layer is used to redistribute the very fine pitched peripheral arrayed pads on the chip to much larger pitch area arrayed pads located in the interior portion of the upper face of the chip where larger solder joints may be provided for connection to the printed circuit board. Thus, the demands on the printed circuit board are much more relaxed using the wafer level chip sale packages.

FIG. 2 illustrates a wafer level chip scale package 10 including a square chip 12, which may be for example, approximately 9.64 by 9.64 mm. The integrated circuit chip 12 includes a silicon base with discrete devices formed therein and metal interconnects overlying the discrete devices in a manner known to those skilled in the art. A plurality of peripheral-arrayed bond pads 14 are provided over the metal interconnects. For example, the bond pads 14 typically may have a size of about 0.1 mm. by 0.1 mm and may be positioned with respect to each other at a pitch of about 0.25 mm. A metal layer or electrically conductive redistribution traces 16 are deposited on top of the wafer to redistribute the fine-pitched peripheral-arrayed bond pads 14 to a much larger pitch area-arrayed pads in the interior of the chip onto which larger solder bump connections 18 are provided. For example, the solder bump connections 18 may be formed on a redistribution pads having a pitch of about 0.75 and a pad size of about 0.3 mm in diameter.

FIG. 3 is a sectional view of a prior art wafer level chip scale package. The wafer level chip scale package includes a semiconductor die 12 having an aluminum bond pad 14 formed on upper surface thereof. A first passivation layer 20 such as silicon dioxide is formed over the top surface of the semiconductor 12 and includes an opening formed therein exposing a portion of the aluminum bond pad 14. A second passivation layer 22 may be deposited over the first passivation layer and also includes an opening therein down to the aluminum bond pad 14. An electrically conductive redistribution trace 24 may be formed over the second passivation layer 24 and into the opening therein and contacting the aluminum bond pad 14. The electrically conductive redistribution trace 24 may include a plurality of layers such as a first titanium layer 26 and a second copper layer 28. A UBM may be provided and includes a first copper layer 30 and nickel layer 32. The metal layers 26, 28, 30 and 32 extend horizontally a distance away from the peripheral-arrayed aluminum bond pad 14 and towards the interior of the chip as illustrated in FIG. 1. A third passivation layer 42 such as a polyimide may be deposited over the UBM layers 30, 32 and may include an opening formed therein for making a connection to the UBM layers 30, 32. Titanium and copper seed layers 34 and 36 may be deposited into the opening in the third passivation layer 42 provided over the UBM layers 30 and 32. A copper core 38 may be deposited over the seed layers 34, 36 and a solder ball 40 formed on the copper core 36. The structure shown in FIG. 3 is manufactured with a number of complicated process steps. Those skilled in the area are constantly looking for alternatives and improved methods of packaging microelectronic devices. The present invention provides alternatives to and advantages over prior art methods of making a wafer level chip scale package.

SUMMARY OF THE INVENTION

A method of making a bump on the semiconductor device including step of providing a substrate having a bond pad thereon. An electrically conductive redistribution trace is deposited over the substrate. The electrically conductive redistribution traces is in electrical contact with the bond pad and extends a distance horizontally from the bond pad. A removable buffer material is deposited over the electrically conductive redistribution trace at a location spaced a distance horizontally from the bond pad. A stress buffer layer is deposited over the substrate and encapsulates the removable buffer material. A portion of the stress buffer layer is removed to expose the removable buffer material. The removable buffer material is removed to provide an opening in the stress buffer layer down to the electrically conductive redistribution trace. An electrically conductive material is deposited in the opening in the stress buffer layer and overlaying the electrically conductive redistribution trace. The electrically conductive material is reflown to provide a bump on the substrate.

Another embodiment of the invention further includes a step of depositing an under bump metallurgy structure over the substrate and in electrical contact with the bond pad prior to depositing the electrically conductive redistribution trace.

In another embodiment of the invention the under bump metallurgy includes a plurality of layers.

In another embodiment of the invention the under bump metallurgy includes a first layer comprising titanium and a second layer comprising copper.

In another embodiment of the invention the stress buffer layer comprises benzocyclobutene.

In another embodiment of the invention the stress buffer layer comprises a polyimide.

In another embodiment of the invention the stress buffer layer comprises a modified polyimide prepreg.

In another embodiment of the invention the electrically conductive material comprises a solder.

In another embodiment of the invention the electrically conductive redistribution trace comprises copper.

Another embodiment of the invention further comprises a step of depositing at least a first seed layer into the opening in the stress buffer layer prior to depositing the electrically conductive material.

In another embodiment of the invention the first seed layer comprises copper.

In another embodiment of the invention further comprises a passivation layer over the substrate and having an opening formed in the passivation layer to expose a portion of the bond pad.

In another embodiment of the invention the step of removing a portion of the stress buffer layer comprises chemical mechanical planarizing the stress buffer layer to expose the removable buffer material.

In another embodiment of the invention the removable buffer material comprises a photoresist.

In another embodiment of the invention the step of removing the removable buffer material comprises wet etching the photoresist.

In another embodiment of the invention the removable buffer material comprises a dry film photoresist.

In another embodiment of the invention the step of removing the removable buffer material comprises wet etching the dry film photoresist.

Another embodiment of the invention includes a method of making a bump on a semiconductor wafer including the step of providing a semiconductor wafer having a contact pad and upper passivation layer and an opening formed in the passivation layer exposing a portion of the contact pad. An under bump metallurgy structure is deposited over the upper passivation layer and the contact pad. An electrically conductive redistribution trace is deposited over the under bump metallurgy structure. The photoresist layer is deposited, patterned and developed to provide a first patterned photoresist layer selectively protecting a portion of the electrically conductive redistribution trace and the under bump metallurgy structure. Excess portions of the electrically conductive redistribution trace and under bump metallurgy structure are removed that are not protected by the first patterned photoresist layer. The first patterned photoresist layer is removed. A second photoresist layer is deposited, patterned and developed over the electrically conductive redistribution trace to provide a second patterned photoresist layer selectively positioned over the electrically conductive redistribution trace at a location spaced a distance horizontally from the contact pad. A stress buffer layer is deposited over the semiconductor device encapsulating the second patterned photoresist layer. The stress buffer layer is chemical mechanical planarized to expose the second patterned photoresist layer. The second patterned photoresist layer is removed to provide an opening in the stress buffer layer down to the electrically conductive redistribution trace. An electrically conductive material is deposited into the opening in the stress buffer layer and reflown to provide a bump on the semiconductor wafer.

Another embodiment of the invention further includes a step of depositing at least a first seed layer into the opening in the stress buffer layer prior to the step of depositing the electrically conductive material into the opening in the stress buffer layer.

In another embodiment of the invention the step of removing the second patterned photoresist layer includes wet etching the second patterned photoresist layer.

These and other objects, features and advantages of the present invention will become apparent from the following brief description of the drawings, detailed description of the preferred embodiments, and appended claims and drawings.

DETAILED DESCRIPTION OF PREFERRED EMBODIMENTS

Figure 1A:
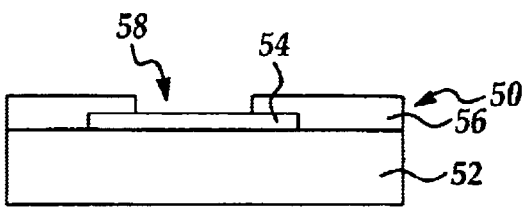
FIG. 1A illustrates the prior art step of providing a semiconductor wafer including a bond pad on an upper surface thereof and a passivation layer overlying the semiconductor wafer and having an opening therein exposing a portion of the bond pad.
Figure 1B:
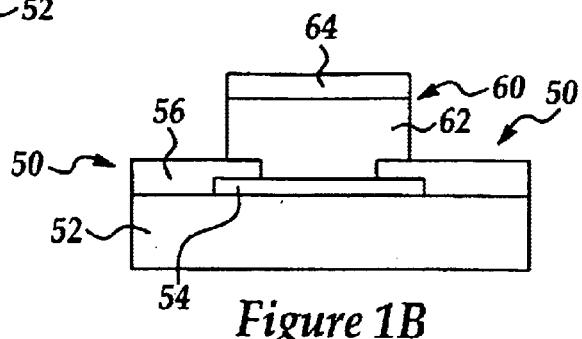
FIG. 1B illustrates a prior art step of providing a removable buffer material over the bond pad of FIG. 1A.
Figure 1C:
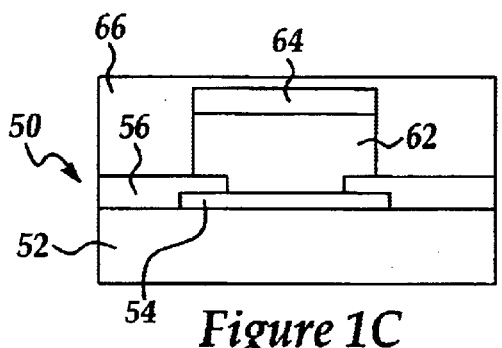
FIG. 1C illustrates a prior art step of depositing a stress buffer layer encapsulating the removable buffer material.
Figure 1D:
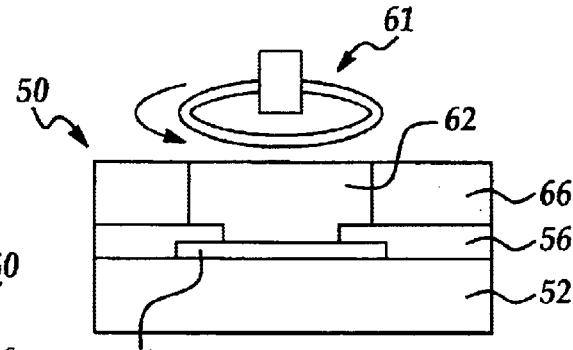
FIG. 1D illustrates a prior art step of chemical mechanical planarizing the stress buffer layer to expose a portion of the removable buffer material.
Figure 1E:
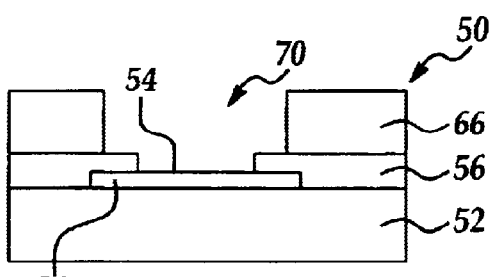
FIG. 1E illustrates a prior art step of removing the removable buffer material to provide an opening in the stress buffer layer.
Figure 1F:
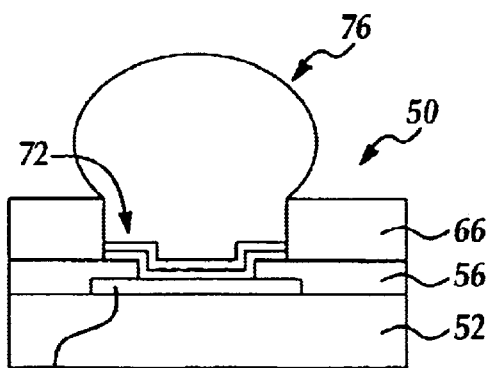
FIG. 1F illustrates the prior art steps of depositing an under bump metallurgy structure into the opening in the stress buffer layer and depositing an electrically conductive material into the opening in the stress buffer layer and onto the under bump metallurgy structure.
Figure 1G:
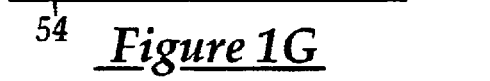
FIG. 1G illustrates prior art step of reflowing the electrically conductive material to provide a bump on the semiconductor wafer.
Figure 2:
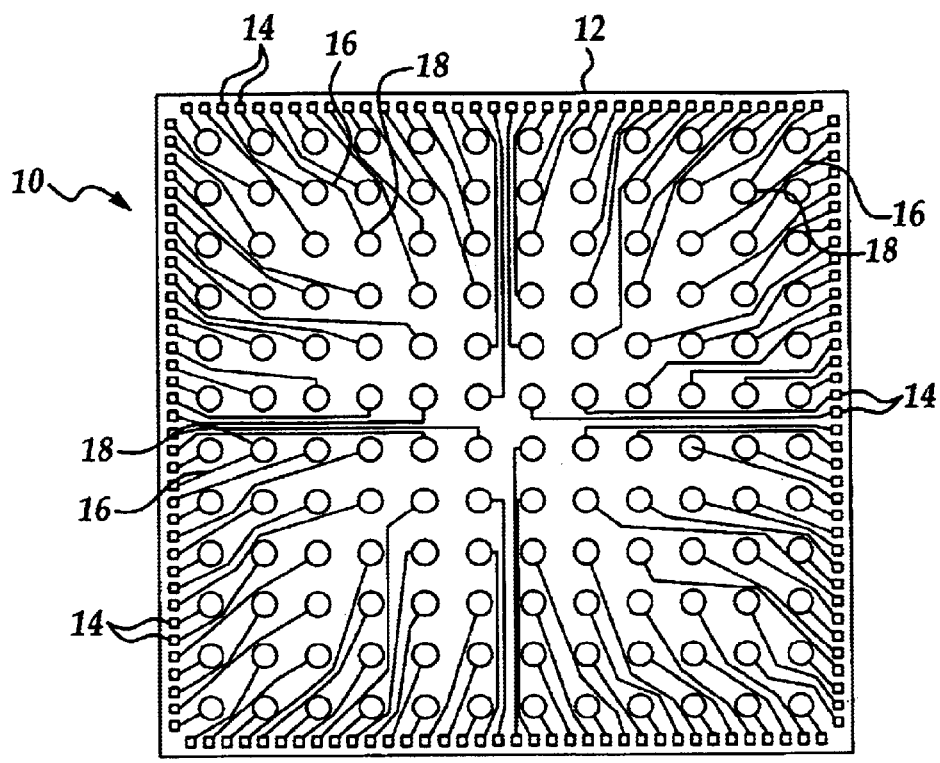
FIG. 2 is a plan view of the prior art wafer level chip scale package.
Figure 3:
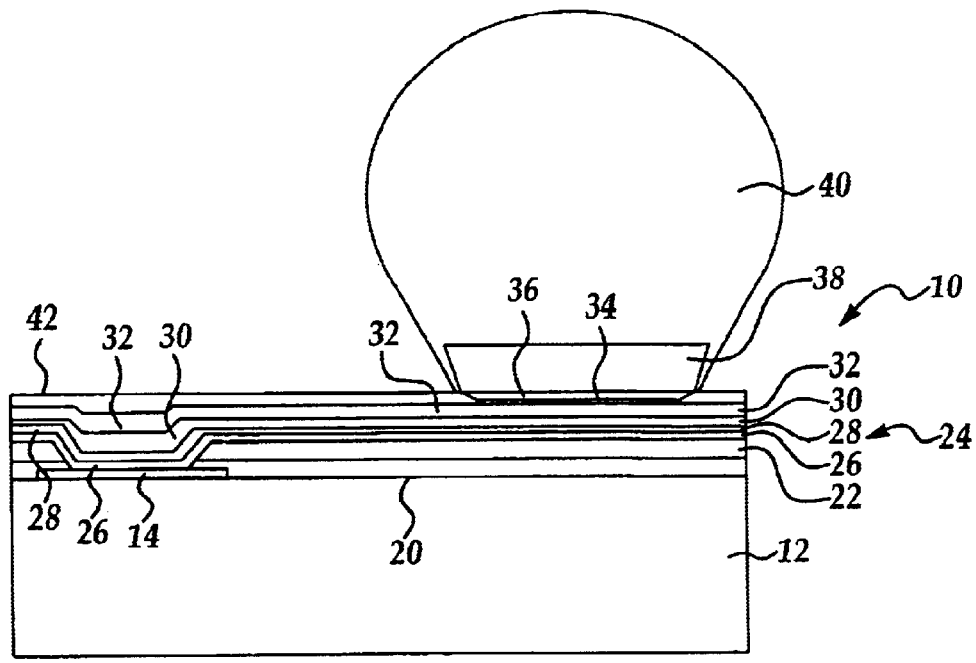
FIG. 3 is a sectional view illustrating a prior art wafer level chip scale package.
Figure 4A:
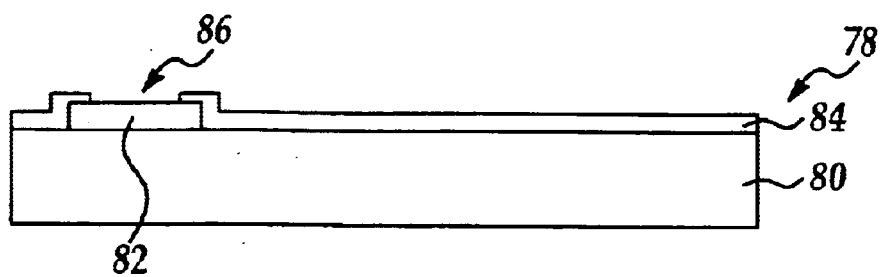
FIG. 4A illustrates the step of providing a semiconductor wafer having a bond pad on upper surface thereof and a passivation layer over the semiconductor wafer including an opening therein exposing a portion of the bond pad according to the present invention.
Figure 4B:
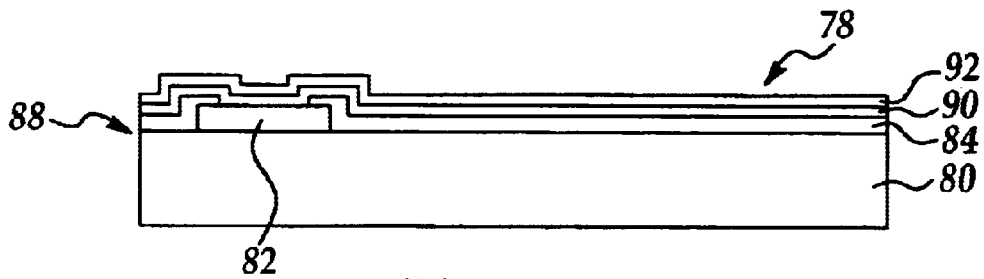
FIG. 4B illustrates the step of depositing an under bump metallurgy structure onto a semiconductor wafer and over the bond pad according to the present invention.
Figure 4C:
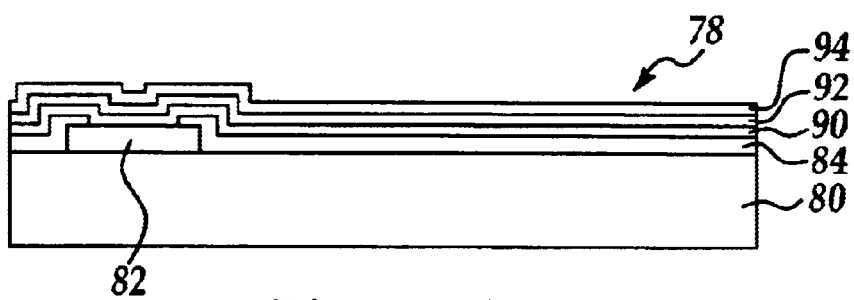
FIG. 4C illustrates the step of depositing an electrically conductive redistribution trace over the under bump metallurgy structure according to the present invention.

FIGS. 4A–L illustrate the steps of a method for forming a bump on a substrate according to the present invention. The term substrate as used herein is not limited to a semiconductor wafer, but includes any structure suitable for forming electrically conductive bumps thereon. In the preferred embodiments, the present invention provides a method of forming a wafer level chip scale package and wherein electrical traces are used for redistribution from a plurality of peripherally arrayed bond pads of an integrated circuit chip to larger bond pads located in the interior upper surface of the integrated circuit chip. A semiconductor device 78 such as a semiconductor wafer is provided including a plurality of device structures formed in a silicon base 80 and a plurality of metal interconnects (not shown) overlying the silicon base and connected to the device structures. A contact or bond pad 82 is provided on upper surface of the semiconductor wafer 78. A passivation layer 84 is provided over the silicon base 80 and includes an opening 86 therein for exposing a portion of the bond pad 82 (FIG. 4A). An under bump metallurgy (UBM) structure 88 may be deposited over the semiconductor wafer (FIG. 4B). The UBM structure 88 may include one, two, three or more layers that are deposited onto the semiconductor wafer by any of a variety of means including sputtering, evaporation, electroplating, electroless plating, or printing. Preferably the UBM structure 88 includes a first layer 90 including titanium deposited over the semiconductor wafer and onto the bond pad 82. Preferably a second layer 92 is provided over the first layer 90 of the UBM structure 88. The second layer 92 preferably includes copper. An electrically conductive redistribution trace 94, preferably a copper layer, is provided over the semiconductor wafer (FIG. 4C). The electrically conductive redistribution trace 94 may also be deposited by sputtering, evaporation, electroplating, electroless plating, or printing.

Figure 4D:
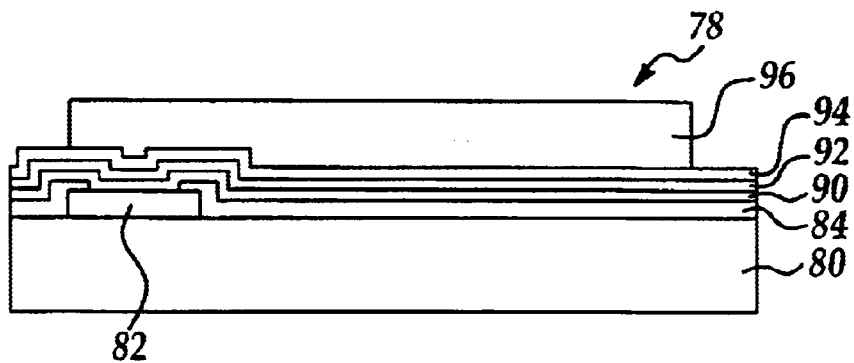
FIG. 4D illustrates the steps of depositing, patterning, and developing a photoresist layer selectively over portions of the electrically conductive redistribution trace and under bump metallurgy structure according to the present invention.
Figure 4E:
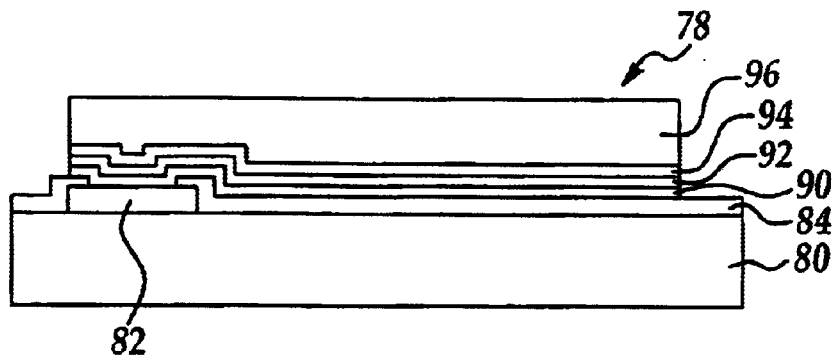
FIG. 4E illustrates a step of removing excess portions of the electrically conductive redistribution trace and under bump metallurgy structure not protected by the patterned photoresist layer according to the present invention.
Figure 4F:
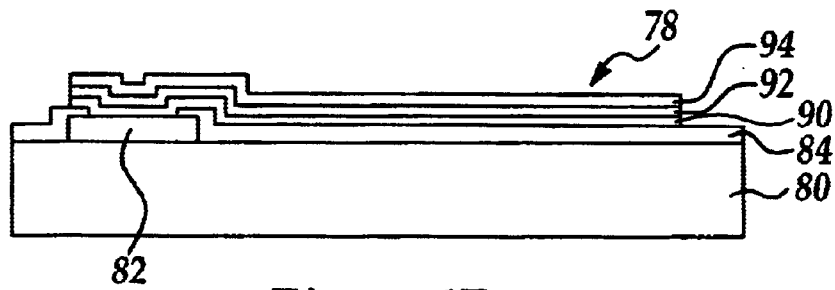
FIG. 4F illustrates a step of removing the patterned photoresist layer according to the present invention.
Figure 4G:
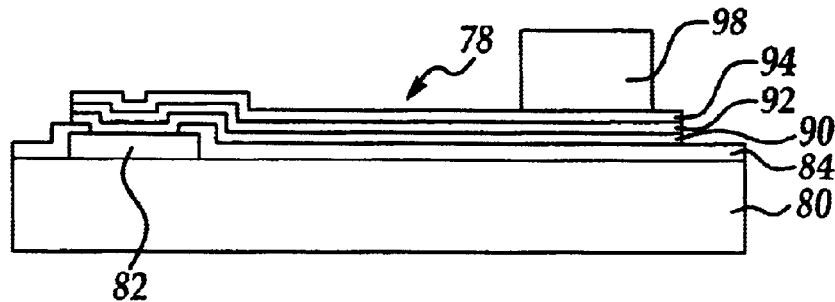
FIG. 4G illustrates the step of selectively depositing a removable buffer material at a location spaced a distance horizontally from the bond pad according to the present invention.

A first photoresist layer 96 is deposited, patterned and developed to selectively protected portions of the electrically conductive trace 94 and the UBM structure 88 (FIG. 4D). The unprotected portions of the electrically conductive trace 94 and the UBM structure 88 are removed by, for example, dry etching (FIG. 4E). The remaining UBM 88 and electrically conductive redistribution trace 94 extend horizontally a distance from the bond pad 82 and towards the interior of the semiconductor device along the top surface thereof. The remaining photoresist layer 96 is removed by a wet etch, stripping or dry etch (FIG. 4F). A removable buffer material 98 such as a second photoresist layer is selectively deposited over the electrically conductive redistribution trace 94 (FIG. 4G). For example, a dry photoresist film may be deposited, patterned and developed to leave a selective portion thereof overlying the electrically conductive redistribution trace 94 and UBM structure 88.

Figure 4H:
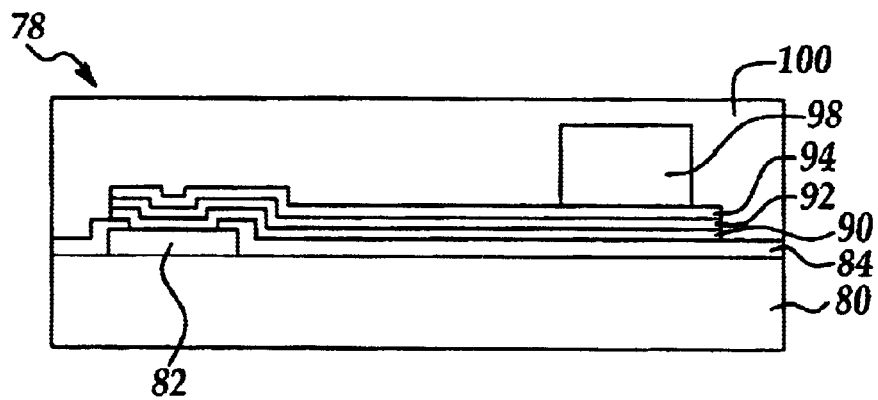
FIG. 4H illustrates the step of depositing a stress buffer layer over the semiconductor wafer and encapsulating the removable buffer layer according to the present invention.
Figure 4I:
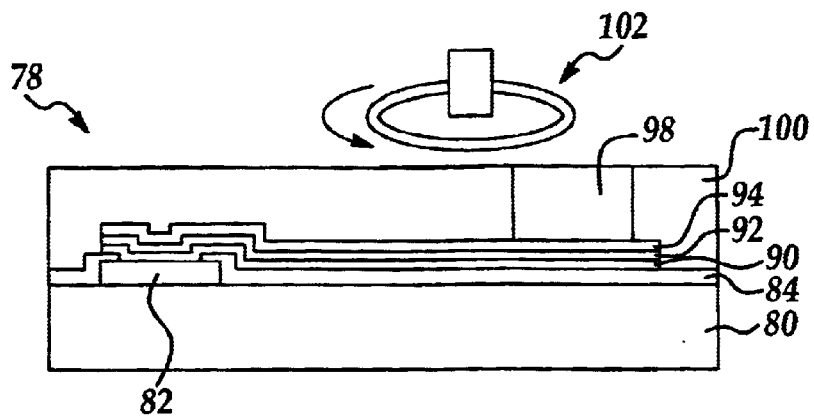
FIG. 4I illustrates a step of chemical mechanical planarizing the stress buffer layer to expose the removable buffer material according to the present invention.

A stress buffer layer 100 is deposited over the semiconductor wafer to encapsulated the removable buffer material (FIG. 4H). The stress buffer layer preferably is a spin on material such as a polyimide, benzocyclobutene (BCB), or a modified polyimide prepreg with a suitable evaporative solvent. The upper portion of the stress buffer layer 100 is removed to expose the removable buffer material 98 (FIG. 4I). Preferably, the upper portion of the stress buffer layer 100 is removed by chemical mechanical planarization using a planarizing or polishing pad 102. The polishing pad 102 is shown in FIG. 4I to rotate with respect to the semiconductor wafer. However, the semiconductor wafer 78 may be rotated with respect to a stationary polishing pad. Typically, chemical mechanical planarization is utilized to provide global surface planarization. Chemical mechanical planarization planarizes the wafer surface by relative motion between the wafer and a polishing pad in the presence of a slurry while applying pressure. The chemical mechanical planarizing tool is often referred to as a polisher. Typically in a chemical mechanical planarization process, the wafer is positioned in a wafer holder, and held against the polishing pad on a flat surface known as platen. The polishing tool uses either rotary or orbital motion. The slurry typically includes abrasive particles in the presence of water with a variety of reagent chemicals. Preferably, the stress buffer layer 100 includes benzocyclobutene and is removed by chemical mechanical planarization with a slurry including ammonia particles and ammonium hydroxide.

Figure 4J:
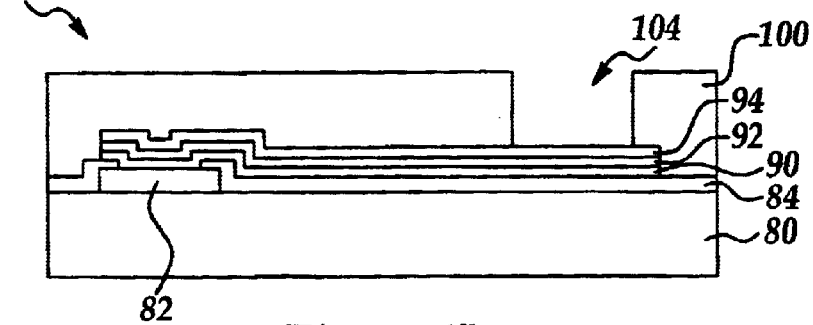
FIG. 4J illustrates the step of removing the removable buffer material to provide an opening in the stress buffer layer down to the electrically conductive redistribution trace according to the present invention.
Figure 4K:
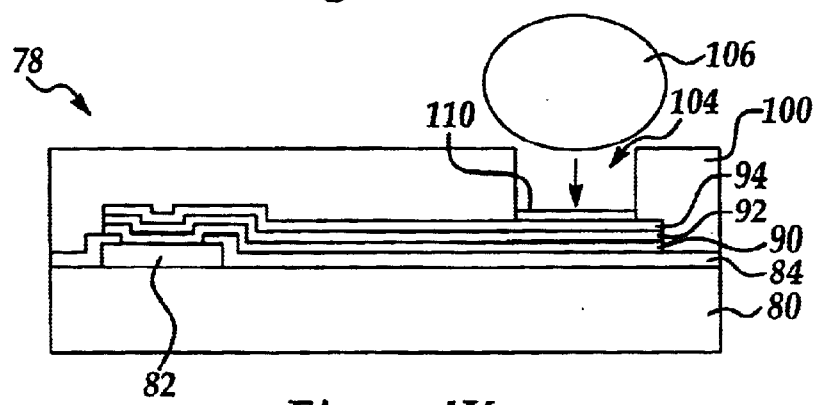
FIG. 4K illustrates the steps of depositing at least a first seed layer into the opening in the stress buffer layer and depositing an electrically conductive material into the opening in the stress buffer layer and over the first seed layer according to the present invention.
Figure 4L:
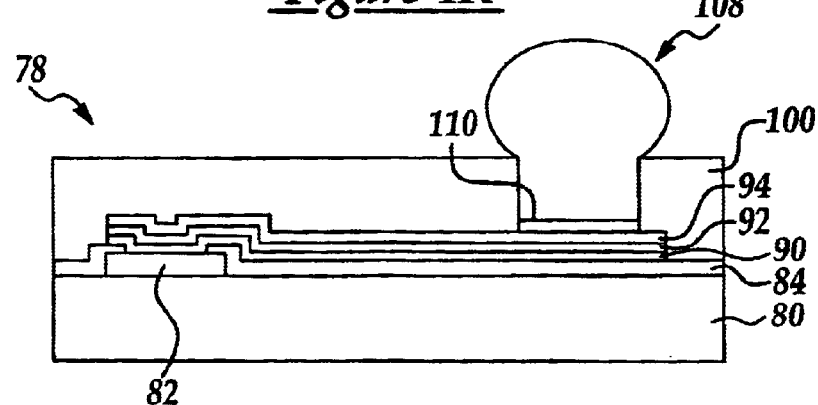
FIG. 4L illustrates a step of reflowing the electrically conductive material to provide a bump on the semiconductor wafer according to the present invention.

Thereafter, the removable buffer material 98 is removed to provide an opening 104 in the stress buffer layer 100 at a location spaced a distance horizontally from the bond pad 82 as shown in FIG. 4J. When the removable buffer material 98 is a photoresist, the photoresist can be removed by wet etching. As shown in FIG. 4K, optionally, a seed layer 110 such as copper may be deposited into the opening 104 and onto the electrically conductive redistribution trace 94. A flux agent may also be deposited into the opening 104 directly onto the electrically conductive redistribution trace 94 or onto the seed layer 110, if present. An electrically conductive material 106 is deposited into the opening 104 in the stress buffer layer 110. The electrically conductive material may be a solder which is deposited by any of the methods described above, such as by depositing a solder ball into the opening 104. The electrically conductive material may also including gold, copper, aluminum nickel, alloys of such metals or other metals, or other metals and materials sufficient to provide electrical contact to the bond pad 82. Finally, the electrically conductive material 106 is reflown by heating to providing a bump or ball 108 on the semiconductor device 78 as shown in FIG. 4L.

What is claimed is:

1. A method of making a bump on a substrate comprising:

providing a substrate having a bond pad thereon;

depositing an electrically conductive redistribution trace over the substrate, and wherein the electrically conductive redistribution trace is in electrical contact with the bond pad and extends a distance horizontally from the bond pad;

selectively depositing a removable buffer material onto the electrically conductive redistribution trace at a location spaced a distance horizontally from the bond pad;

depositing a stress buffer layer over the substrate and encapsulating the removable buffer material;

removing a portion of the stress buffer layer to expose the removable buffer material;

removing the removable buffer material to provide an opening in the stress buffer layer down to the electrically conductive redistribution trace;

depositing an electrically conductive material into the opening in the stress buffer layer and overlying the electrically conductive redistribution trace; and reflowing the electrically conductive material to provide a bump on the substrate.

2. A method as set forth in claim 1 further comprising depositing an under bump metallurgy structure over the substrate and in electrical contact with the bond pad prior to depositing the electrically conductive redistribution trace.

3. A method as set forth in claim 2 wherein the under bump metallurgy includes a plurality of layers.

4. A method as set forth in claim 2 wherein the under bump metallurgy includes a first comprising titanium and second layer comprising copper.

5. A method as set forth in claim 1 wherein the stress buffer layer comprises benzocyclobutene.

6. A method as set forth in claim 1 wherein the stress buffer layer comprises a polyimide.

7. A method as set forth in claim 1 wherein the stress buffer layer comprises a modified polyimide prepreg.

8. A method as set forth in claim 1 wherein the electrically conductive material comprises solder.

9. A method as set forth in claim 1 wherein the electrically conductive redistribution trace comprises copper.

10. A method as set forth in claim 1 further comprising the step of depositing at least a first seed layer into the opening in the stress buffer layer prior to depositing the electrically conductive material.

11. A method as set forth in claim 10 wherein the first seed layer comprises copper.

12. A method as set forth in claim 1 further comprising a passivation layer overlying the substrate and having an opening formed in the passivation layer to expose a portion of the bond pad.

13. A method as set forth in claim as set forth in claim 1 wherein the act of removing a portion of the stress buffer layer comprises chemical mechanical planarizing the stress buffer layer to expose the removable buffer material.

14. A method as set forth in claim 1 wherein the removable buffer material comprises a photoresist.

15. A method as set forth in claim 14 wherein the act of removing the removable buffer material comprises wet etching the photoresist.

16. A method as set forth in claim 1 wherein the removable buffer material comprises a dry film photoresist.

17. A method as set forth in claim 16 wherein the act of removing the removable buffer material comprises wet etching the dry film photoresist.

18. A method of making a bump on a semiconductor wafer comprising:

providing a semiconductor wafer having a contact pad and having an upper passivation layer and an opening formed in the passivation layer exposing a portion of the contact pad;

depositing an under bump metallurgy structure over the upper passivation layer and the contact pad;

depositing an electrically conductive redistribution trace over the under bump metallurgy structure;

depositing, patterning and developing a first photoresist layer to provide a first patterned photoresist layer selectively protecting a portion of the electrically conductive redistribution trace and the under bump metallurgy structure;

removing excess portions of the electrically conductive redistribution trace and the under bump metallurgy structure not protected by the first patterned photoresist layer;

removing the first patterned photoresist layer;

depositing, patterning and developing a second photoresist layer over the electrically conductive redistribution trace to provide a second patterned photoresist layer selectively positioned over the electrically conductive redistribution trace at location spaced a distance horizontally from the bond pad;

depositing a stress buffer layer over the semiconductor wafer encapsulating the second patterned photoresist layer;

mechanical planarizing the stress buffer layer to expose the second patterned photoresist layer;

removing the second patterned photoresist layer to provide an opening in the stress buffer layer down to the electrically conductive redistribution trace;

depositing an electrically conductive material into the opening in the stress buffer layer; and and reflowing the electrically conductive material to provide a bump on the semiconductor wafer.

19. A method as set forth in claim 18 further comprising the step of depositing at least a first seed layer into the opening in the stress buffer layer prior to the step of depositing electrically conductive material into the opening in the stress buffer layer.

20. A method as set forth in claim 18 wherein the step of removing the second patterned photoresist layer comprises wet etching the second patterned photoresist layer.

\* \* \* \* \*